US005867580A

United States Patent [19]

Anderson et al.

[11] Patent Number: 5,867,580

[45] Date of Patent: Feb. 2, 1999

[54] FLEXIBILITY DIGITAL SOUND RELAXATION SYSTEM

[75] Inventors: Troy Gene Anderson, Marblehead, Mass.; Rudy Anthony Vandenbelt, Ottawa, Canada

[73] Assignee: Headwaters Research & Development, Inc., Ottawa, Canada

[21] Appl. No.: 706,134

[22] Filed: Aug. 30, 1996

[51] Int. Cl.[6] .................................................. H03G 3/00

[52] U.S. Cl. ........................................................... 381/61

[58] Field of Search ................................ 381/61, 62, 63, 381/118; 84/603, 604, 605, 606; 704/272; 40/906, 717, 455, 457; 340/825.24, 825.25; 369/30

[56] References Cited

U.S. PATENT DOCUMENTS

| | | | |
|---|---|---|---|
| 4,614,144 | 9/1986 | Sagara et al. | 340/825.25 |
| 5,504,836 | 4/1996 | Loudermilk | 704/272 |
| 5,546,466 | 8/1996 | Ishiguro et al. | 381/61 |
| 5,625,608 | 4/1997 | Grewe et al. | 340/825.24 |

OTHER PUBLICATIONS

"Digital Sound Soother XS," Instruction Manual, author and date presently unknown.

"Marsona® 1250 Sound Conditioner," Instruction Manual, author and date presently unknown.

"Marsona® 1280 Sound Conditioner," Instruction Manual, author and date presently unknown.

"Bookman® Electronic Books," Products' Advertisement Sheet, author and date presently unknown.

*Primary Examiner*—Vivian Chang

*Attorney, Agent, or Firm*—Albert Peter Durigon

[57] ABSTRACT

In one embodiment, an improved-customizability digital sound relaxation system having a sound card receiving port and a collectable sound card are cooperative to play prerecorded natural or other sounds by depressing one of a plurality of sound selector switches and a sound card selector switch. The new sounds of each collectable sound card customize the library of available sounds to individual taste. In another embodiment, an improved-flexibility digital sound relaxation system having at least two (2) prerecorded sounds stored at first and second memory locations of internal or external/internal memory devices may be selected and combined for concurrent and/or individual replay by depressing one of a plurality of sound selector switches and a combine switch, or by depressing one of a plurality of sound selector switches, a sound card selector switch and a combine switch. In this manner, from eighteen (18) digitally prerecorded sounds of the preferred embodiment ninety (90) individually selectable and/or combinable sounds are made available. In either embodiment, natural or other sounds may be stored in loop or sound bite format in either or both of the internal and external memories.

6 Claims, 7 Drawing Sheets

FLEXIBILITY DIGITAL SOUND RELAXATION SYSTEM

CROSS-REFERENCE TO RELATED APPLICATIONS

This invention is related to co-pending United States utility patent application entitled Improved-Customizability Digital Sound Relaxation System filed on even date herewith and by the same inventive entity as herein.

FIELD OF THE INVENTION

This invention is drawn to the field of audio components, and more particularly, to an improved-customizability digital sound relaxation system.

BACKGROUND OF THE INVENTION

It is known that naturally recurring sounds of nature, like rainfall or the rolling of the ocean surf, possess the power to calm and sooth. Various techniques that have simulated these natural sounds in the home or office, both to reproduce their calming and soothing effect and to mask unwanted noise, have often resulted in improved mental concentration and enhanced relaxation.

LP's, CD's or audio cassettes belong to one class of devices that have been employed to reproduce such natural or other sounds in the home or office.

For this class of devices, preselected natural sounds are recorded on the LP's, CD's or audio cassettes and replayed on the corresponding sound reproduction equipment, such as a record player, CD player or tape deck.

Although these media offer the advantage of comparatively-long intervals of continuous, non-repetitive replay, they are subject to a potentially annoying and disruptive repeat/rewind cycle, can be cumbersome to use and are subject to wear and tear over their useful life.

When the record needs to be turned over, or when the audio cassette continuous replay mechanism resets itself, or when the CD player, following its replay program, stops to reposition its read laser, such devices exhibit a quite pronounced disruption of the natural sound being reproduced thereby, which may impair its intended calming and soothing effects. In addition, any background noise is unmasked during the repeat cycle, which likewise may adversely impact the intended calming and soothing effects of the natural sound being replayed.

The collectability of the CD's, LP's and audio cassettes of this class of devices offers individuals the advantage to customize their library of prerecorded natural sounds according to individual taste. However, the separate purchase of another LP, CD or audio cassette is typically required for each and every different sound to be collected.

Another class of devices for playing prerecorded natural or other sounds in the home or office is represented by the so-called digital sound soother, or sound conditioner, devices. For this class of devices, any one of a plurality of natural sounds prerecorded in internal digital memory (ROM) is selected for replay by the touch of a control button. In the Tranquil Moments™ TM-500 Sound Relaxation System commercially available from the Brookstone, Inc. Company, six (6) natural and other sounds are digitally recorded (Ocean, Stream, Rain, Waterfall, Summer Night and Soother sounds), and in the Marsona® 1250 Sound Conditioner, ten (10) natural sounds (Surf; Surf with random overlay of Sea Gulls & Bell Buoy at random times; Surf "2"; Rain Downpour; Rain Shower; Rain Shower with random overlay of Evening Bird Songs at random times; Waterfall; Crickets and Spring Peepers randomly overlaid on Rain, and Babbling Brook sounds) are prerecorded therein. The Marsona® 1250 Sound Conditioner is commercially available from the Marpac Corporation.

In the Digital Sound Soother XS, commercially available from Sharper Image, Inc., three (3) types of continuous sounds are available for selection, a Harbor sound with Waves and Gulls, a Countryside sound with Crickets and Frogs, and a White Noise sound. To the continuous Harbor sound, auxiliary Fog Horn, Seal and Ships Bell sounds may be randomly overlayed by an auxiliary sounds volume control slide, and to the continuous Countryside sound, auxiliary Dove, Owl, Wolf and Loons sounds may be randomly overlayed by the volume slide.

The utility of the heretofore known sound soother, or sound conditioner, devices, however, has been limited by their lack of customizability and by their inflexibility.

The heretofore known devices have been inflexible, in that the only choice of sounds presented to individuals has been limited to the selection of the particular prerecorded natural sounds digitally stored therein. For the Tranquil Moments™ TM-500 Sound Relaxation System, for example, one, and only one, of the Ocean, Stream, Rain, Waterfall, Summer Night and Soother sounds may be selected for replay by depressing a corresponding sound selector button. The Marsona® 1250 Sound Conditioner device, also only allows one, and only one, of the sounds prerecorded therein to be selected for replay by depressing a corresponding sound selector button. For the Digital Sound Soother XS device, the volume slide only controls the volume (from "off" to full volume) of the auxiliary sounds that are overlaid on the continuous sounds thereof.

The heretofore known sound soother, or sound conditioner, devices have suffered from a lack of customizability, in that individuals who for any reason desire a natural sound not prerecorded in the internal digital memory of the heretofore known devices have had no choice but to acquire another such device that does have the desired natural sound prerecorded therein. Not only has this resulted in frustration if no such device were available, but has required another cash outlay for the other sound soother device that contained the desired sound.

SUMMARY OF THE INVENTION

Accordingly, it is one object of the present invention to disclose an improved digital sound relaxation system that offers the advantages of the heretofore known devices and techniques but which exhibits none of their attendant disadvantages.

It is another object of the present invention to provide a device that allows individuals to tailor sound playback to their personal preferences.

It is another object of the present invention to disclose an improved digital sound relaxation system that enables individuals to selectably choose, according to their individual tastes, a combination of any, at least two (2), individual prerecorded natural sounds of a plurality of prerecorded natural sounds for concurrent replay.

In accord therewith, the present invention discloses an improved-flexibility digital sound relaxation system having (1) a first digital memory in which a first plurality of prerecorded natural and/or sounds are stored in a predetermined manner; (2) a like plurality of control switches, each for selecting another one of said first plurality of prerecorded natural sounds stored in said first digital memory for replay;

(3) a second digital memory in which a second plurality of prerecorded natural sounds are stored in a predetermined manner; (4) a like plurality of control switches, each for selecting another one of said second plurality of prerecorded natural sounds stored in said second digital memory for replay; and (5) a combine switch to select for concurrent replay a sound that is a combination of the sounds selected by depressing one of each of said first and second pluralities of switches. In this manner, the digital sound relaxation system of the invention allows to select any prerecorded sound of its library of prerecorded sounds for single replay, and allows to select any prerecorded sound for concurrent replay with any other prerecorded sound, thereby greatly enhancing the flexibility with which its library of prerecorded sounds may be selected for replay. In the presently preferred embodiments, the prerecorded natural sounds are stored in one of a "loop" format and a "sound bite" format. The loop format defines (1) a plurality of addressable memory locations and (2) start and end locations, such that a different part of the same natural sound is stored at another address location and in such a way that the parts stored at the start and end locations are as acoustically-seamless as possible, and the sound bite format defines at least two (2) pluralities of addressable memory locations, such that another self-contained and complete-in-itself version of the same natural sound is stored in each of said at least two (2) pluralities of addressable memory locations. The sound bite format is particularly well-suited for sporadic-type natural and other sounds, such as Loon or Foghorn or Harbor Buoy or Thunder sounds, and the loop format is particularly suited for storing repetitive-type natural and other sounds, such as Rain or Waterfall sounds.

In alternative embodiments, the first and second memories may be internal memories, or one may be an internal, and the other may be an external, memory.

BRIEF DESCRIPTION OF THE DRAWINGS

Other objects, advantageous features and inventive aspects of the present invention will become apparent as the invention becomes better understood by referring to the following detailed description of the presently preferred embodiments, and to the drawings, wherein.

DETAILED DESCRIPTION OF THE PREFERRED EMBODIMENTS

The term digital sound relaxation system as used herein denotes any device having (1) one or more operator input devices for allowing selection of individual ones of a plurality of prerecorded natural (and/or other) sounds, (2) a digital memory in which are stored the plurality of prerecorded natural or other sounds to be selected by the one or more operator input devices and (3) a digital controller responsive to one or more operator input selections to replay the selected one of the plurality of prerecorded sounds.

As used herein, the term collectable sound card means any device having (1) a digital memory in which a plurality of natural or other sounds are stored in a predetermined format and (2) a connector member for connection with a digital sound relaxation system.

Figure 1A:
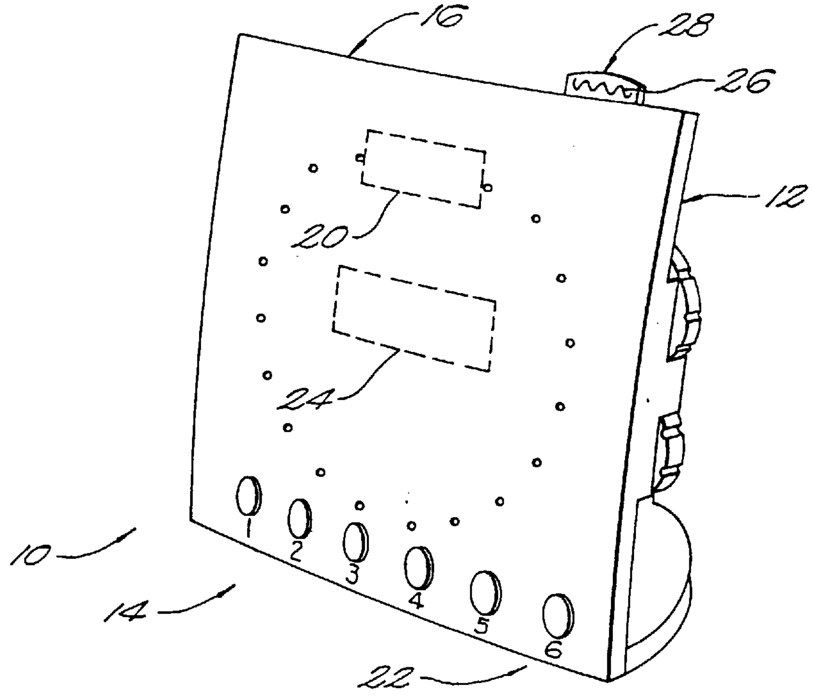
FIG. 1 illustrates in the FIGS. 1A, 1B thereof front and rear perspective views of one embodiment of an improved sound relaxation system in accord with the present invention providing individuals the capability to customize their library of natural sounds.
Figure 1B:
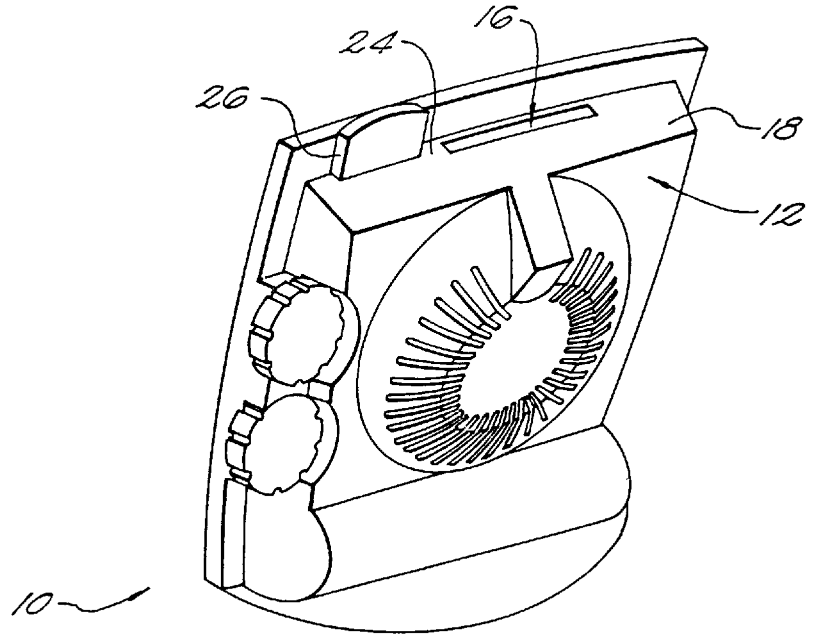

Referring now to FIGS. 1A, 1B, generally designated at 10 are front and rear perspective views of one presently preferred embodiment of an improved digital sound relaxation system in accord with the present invention. The device 10 of the invention provides individuals the capability to customize their library of natural sounds, by adding sounds contained in a collectable sound card to be described.

The improved system 10 includes a housing generally designated 12 and a plurality of sound selector switches generally designated 14. The switches 14 are arranged in laterally spaced apart relation proximate the bottom edge of the housing 12. Although six (6) individual selector switches 14 are presently preferred, any input device or devices for allowing selection of individual ones of a plurality of prerecorded natural sounds to be described may be employed in accord with the present invention.

A collectable sound card receiving port generally designated 16 is provided through the top wall 18 of the housing 12. Although it is preferred to locate the port 16 through the top wall 18 of the housing 12, any other collectable sound card receiving interface that is user-friendly, and easy-to-access, may be employed in accord with the present invention.

An electrical connector schematically illustrated in dashed outline 20 is provided in the port 16 of the housing 12. The electrical connector 20 is adapted to mate with the electrical connector to be described of a collectable sound card.

Figure 2:
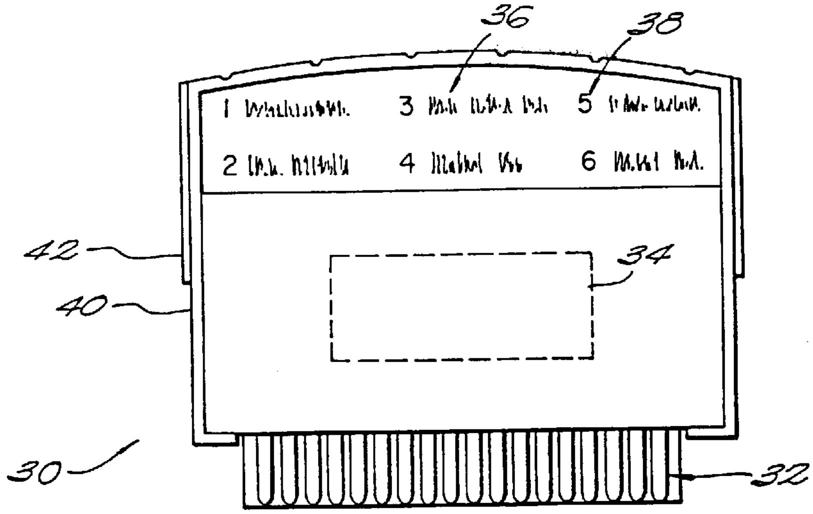
FIG. 2 is a front elevational view of a collectable sound card for a digital sound relaxation system in accord with the present invention.

Referring now briefly to FIG. 2, generally designated at 30 is a front elevational view of a collectable sound card in accord with the present invention. An electrical connector generally designated 32 is provided at the bottom end thereof. The collectable sound card 30 is slidably received within the port 16 (FIG. 1) of the housing 12 (FIG. 1), in such a way that the connector 32 of the collectable sound card 30 mates with the electrical connector 20 (FIG. 1) provided therefor in the sound card receiving port 16 (FIG. 1).

The collectable sound card 30 includes a digital memory illustrated in dashed outline 34 in which are stored, in a manner to be described, a plurality of preselected natural or other sounds. In the presently preferred embodiments, memory 34 includes four (4) megabytes of RAM memory in which six (6) prerecorded sounds are digitally stored, although a different memory size, and a different number of prerecorded sounds, may be employed in accord with the present invention.

The collectable sound card 30 bears first indicia schematically illustrated by "wavy lines" generally designated 36, that names or otherwise identifies each of the particular natural sounds prerecorded in its digital memory 34, and bears second whole number indicia generally designated 38, that enumerates the prerecorded natural sounds of its memory 34. The whole number indicia 38 correspond to whole number indicia generally designated 22 (FIG. 1) provided proximate to each of the sound selector switches 14 (FIG. 1) along the bottom edge of the housing 12 (FIG. 1). Although the corresponding indicia 22, 38 on the collectable sound card 30 and proximate the switches 14 (FIG. 1) of the device 10 (FIG. 1) are in the form of the whole numbers from one (1) to six (6), other indicia may be employed to correlate or associate each prerecorded natural sound identified by the indicia 36 with another switch 14 (FIG. 1) in accord with the present invention. Indicia, not shown, may be provided on the rear of the collectable sound card 30 that names, as a whole, the particular collection of natural (and/or other) sounds contained on each collectable sound card 30.

Travel-limiting shoulders 42 are preferably provided on the side walls 40 of the collectable sound card 30. The travel-limiting shoulders 42 abut walls 24 (FIG. 1) of the port 16 (FIG. 1), when it is slidably received therewithin, thereby seating the same in the device 10 (FIG. 1). The collectable sound card 30 is preferably provided on its back face with a contour, not shown, that conforms to the thumb of a user, and arcuate ribs, not shown, are provided in spaced-apart relation in the contour to frictionally grip the thumb when received therewithin.

Returning now to FIG. 1, the device 10 includes an internal digital memory schematically illustrated in dashed line 24 in which a plurality of prerecorded natural or other sounds are digitally stored in a manner to be described.

A two-position selector switch 26 is slidably mounted to the top wall 18 of the housing 12. In the "off" position, not shown, of the two-position selector switch 26, the switch is recessed lower within the housing 12, while in its illustrated "on" position, the head of the switch 26 appears above the top wall 18 of the device 12. In the "on" position of the selector switch 26, indicia schematically illustrated by "wavy lines" generally designated 28 appear above the top wall 18 of the device 10 to indicate that the collectable sound card receiving port 16 has been activated.

As appears more fully below, in the "off" position of the selector switch 26, depressing any one of the switches 14 selects another one of the prerecorded natural sounds stored in the memory 24 for replay, while in the "on" position of the selector switch 26, depressing any one of the switches 14 selects another one of the prerecorded natural sounds stored in the external memory 34 (FIG. 2) of the collectable sound card for replay The correlative indicia 22, 38 (FIGS. 1 and 2, respectively) indicate which sounds, as indicated by indicia 36 (FIG. 2), of the collectable sound card correspond to which sound selector switches of 14 of the device 10. In this manner, the same sound selector switches 14 are enabled to select among the plurality of prerecorded natural sounds contained either in the internal memory 24 the device 10 or in the external memory 34 (FIG. 2) of each collectable sound card.

The device 10 includes an on/off rotary switch, a four (4)-position interval selector switch and a pause/resume button. These switches form no part of the present invention and are not further described herein.

The prerecorded natural sounds may be digitally stored in internal and/or external digital memory in one of a loop format and a sound bite format. In general, the loop format is preferred for continuous-type natural and/or other sounds, such as an ongoing Rain sound or an always-surging Brook sound, while the sound bite format is preferred for sporadic-type natural and/or other sounds, such as Sea Gulls or Thunder sounds.

Figure 3A:
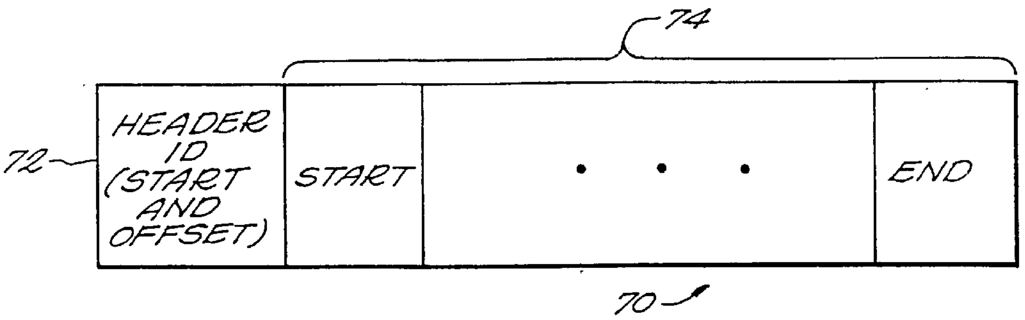
FIG. 3 illustrates in the FIGS. 3A, 3B thereof diagrams respectively representing loop format and sound bite format data structures in accord with the present invention.

Referring now to FIG. 3A, generally designated at 70 is a diagram illustrating a loop format data structure. The loop format data structure 70 includes a header 72. The header 72 identifies itself as "loop format" and identifies the length of the data record stored in loop format. As schematically shown by a bracket 74, the loop format defines (1) a plurality of addressable memory locations and (2) start and end locations, such that a different part of the same natural (or other) sound is digitally stored at another address location and in such a way that the parts digitally stored at the start and end locations are as acoustically-seamless as possible. A processor-implemented loop format subroutine to be described is called whenever a header identifies itself as loop format for replaying each at least one prerecorded natural (or other) sound digitally stored in loop format. In the presently preferred embodiments, each prerecorded natural sound stored in loop format is allocated approximately two-thirds (0.66) MB of memory, which has been found to provide minimalized perception of sound repetition during playback.

Figure 3B:
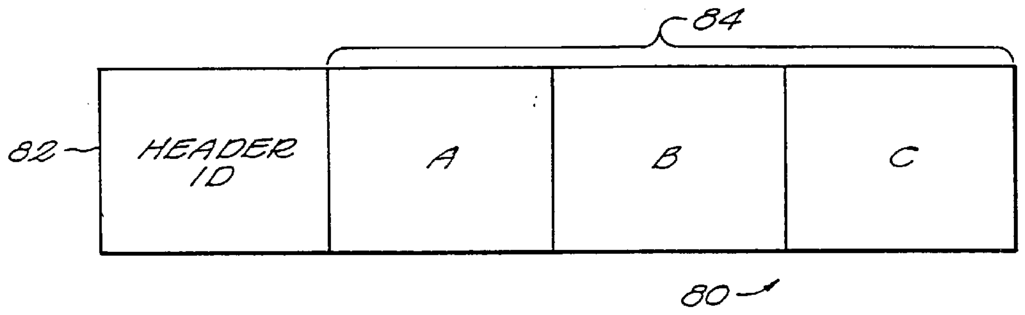

Referring now to FIG. 3B, generally designated at 80 is a diagram illustrating a sound bite type format data structure in accord with the present invention. The sound bite type format data structure 80 is particularly well suited for sporadic-type natural sounds, providing natural sounding (free of perceived repetition) sound reproduction with a minimum usage of digital memory space. The sound bite format data structure 80 includes a header portion 82. The header 82 identifies itself as a sound bite type format data structure and identifies the locations and lengths of three (3) data records. As shown by a bracket 84, the sound bite format defines three (3) pluralities of addressable memory locations designated "A", "B", and "C," such that another self-contained and complete-in-itself version of the same natural (or other) sound is digitally stored in each of said three (3) pluralities of addressable memory locations. A processor-implemented sound bite format subroutine to be described is called whenever a header identifies itself as sound bite format for replaying each at least one prerecorded natural and/or other sound digitally stored in sound bite format.

At each of the addressable groups of memory locations "A," "B," and "C" another self-contained and complete-in-itself version of the same prerecorded natural sound is digitally stored. For example, at "A" may be digitally encoded data of a prerecorded Crack sound, at "B" a Low Rumble sound and at "C" the High Rumble sound of the same Thunder sound. To take another example, three (3) different self-contained and complete-in-themselves versions of the same Loon Call sound may be stored in sound bite format at respective ones of the groups of the addressable memory locations marked “A,” “B,” and “C.”

Returning now briefly to FIG. 1, the device 10 of the invention is operable in one of two (2) basic modes. In one mode, any prerecorded sound stored in internal digital memory in either sound bite or loop formats is replayed by depressing the corresponding one of the sound selector switches, and in another mode, any prerecorded sound stored in external digital memory in either sound bite or loop formats of a collectable sound card inserted therewithin is replayed by depressing the sound card selector switch and by depressing the corresponding one of the sound selector switches. Any digital processor programmed to provide operation in these two (2) modes may be employed in accord with the present invention.

Figure 4:
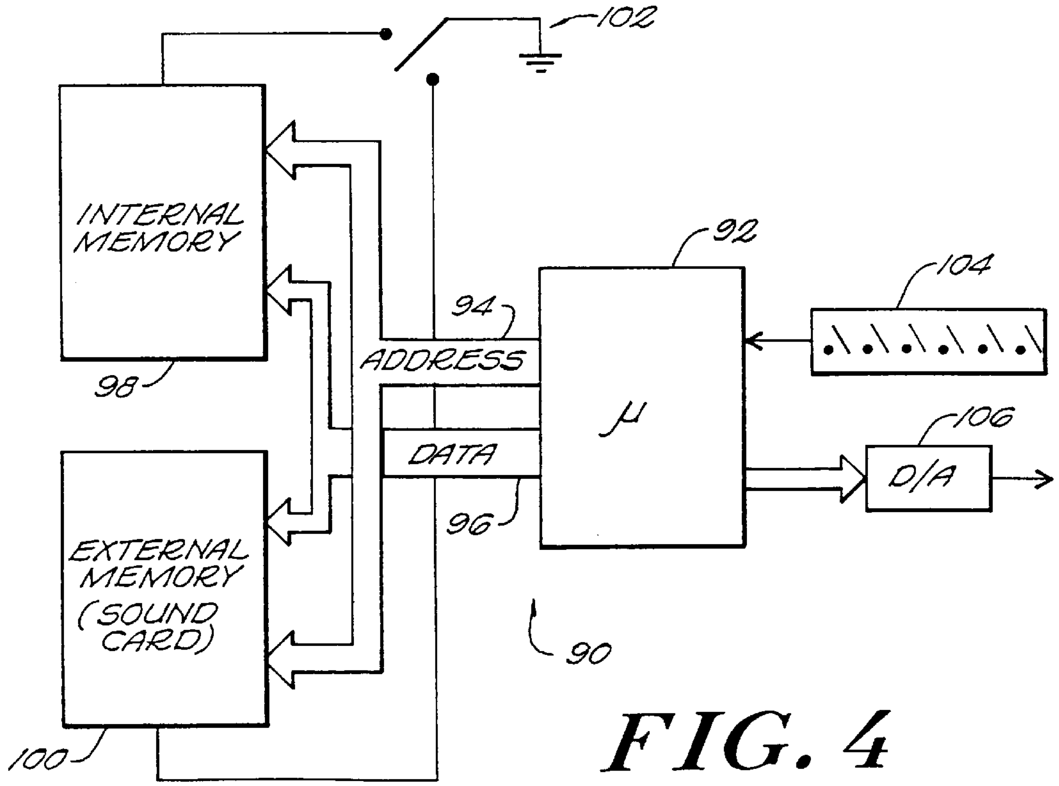
FIG. 4 is a circuit block diagram of an exemplary embodiment of the improved sound relaxation system of the FIG. 1 in accord with the present invention.

Referring now to FIG. 4, generally designated at 90 is a circuit block diagram of an exemplary embodiment of the improved digital sound relaxation system of FIGS. 1 and 2 in accord with the present invention. Processor 92 is connected via address and data lines 94, 96 to internal digital memory (RAM) 98 and to external digital memory (RAM) 100. Sound card selector switch generally designated 102 is electrically connected between ground and the chip enable terminals of the internal and external digital memories 98, 100, and a plurality of sound selector switches 104 are connected to the input of the microcontroller 92. Program read only memory (ROM), not shown, having a main routine and loop format and sound bite format play subroutines to be described is connected in well-known manner to the address and data lines 94, 96.

A digital to analog converter 106 is coupled to the output port of the microcontroller 92. An analog amplifier and an output transducer, both not shown, are connected downstream of the digital to analog converter 106 to amplify and condition the prerecorded natural sounds selected for audible replay in well-known manner.

Figure 5:
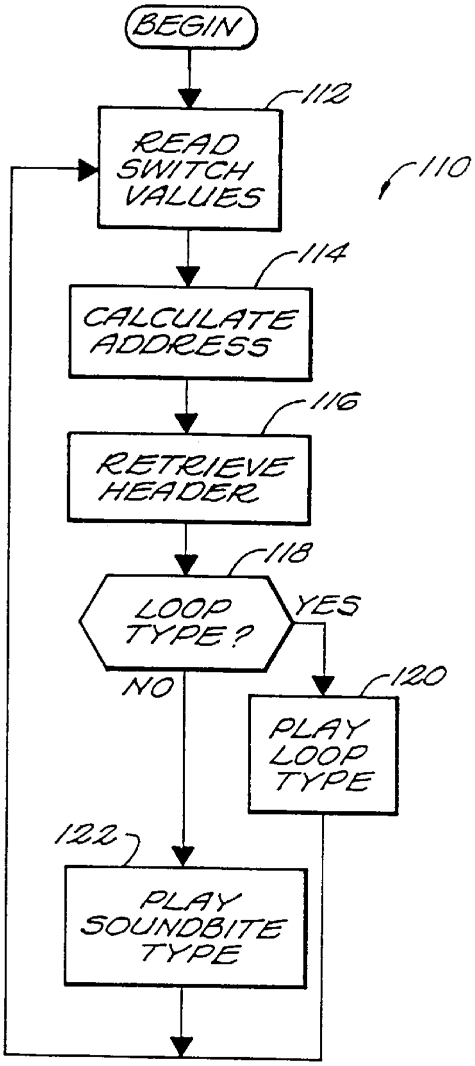
FIG. 5 is a flow chart illustrating an exemplary processor-implemented main routine of the exemplary FIG. 4 embodiment in accord with the present invention.

Referring now to FIG. 5, generally designated at 110 is a flowchart of the main routine implemented on the processor 92 of the FIG. 4 for playing prerecorded natural and/or other sounds digitally stored in either loop format or sound bite type format in accord with the present invention.

As shown by a block 112, the processor is operative to read the values of the depressed switches to determine which prerecorded sound digitally stored on either the external digital memory of the collectable sound card or on the internal digital memory has been selected for replay.

As shown by a block 114, the processor is then operative to calculate the address in memory of the data structure of the selected sound, and to retrieve the corresponding header portion thereof as shown by a block 116.

As shown by a block 118, the processor is then operative to determine whether the header portion of the data structure of the selected sound identifies itself as loop format, and if it does, a loop format play subroutine is called as shown by a block 120, but if it does not so identify itself, a sound bite format play subroutine is called as shown by a block 122. Processing then returns to the block 112.

Figure 6:
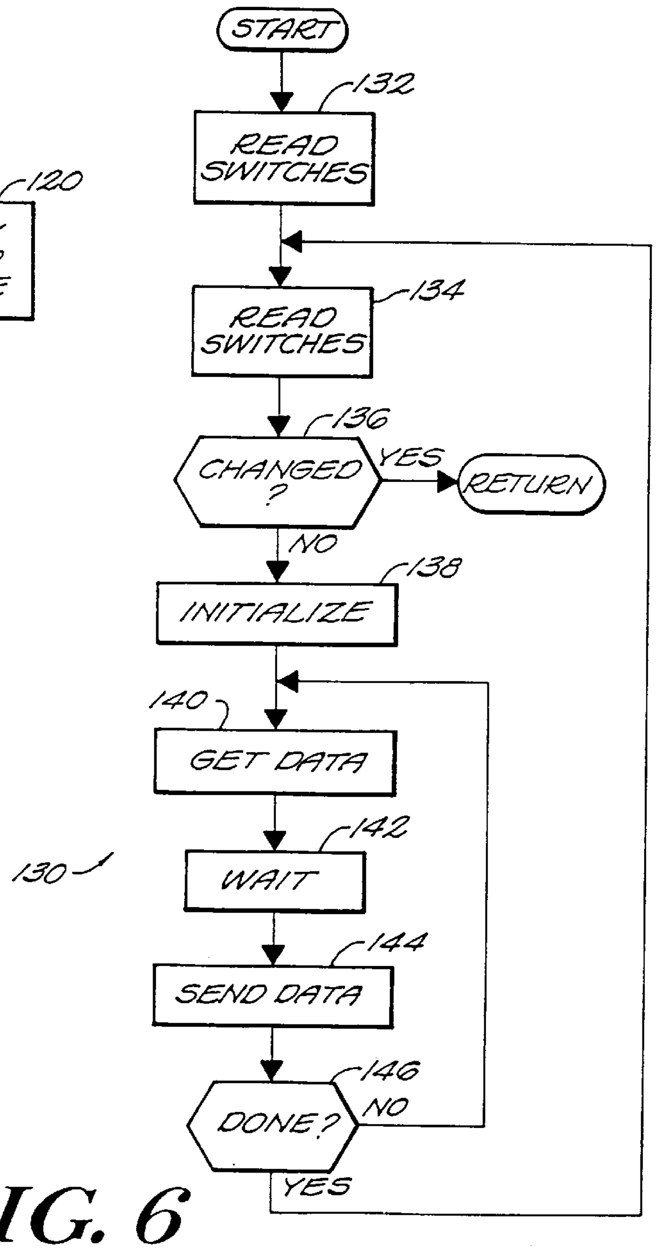
FIG. 6 is a flow chart illustrating an exemplary processor-implemented loop format play subroutine in accord with the present invention.

Referring now to FIG. 6, generally designated at 130 is a flow chart illustrating the loop format play subroutine in accord with the present invention. As shown by blocks 132, 134, the processor is operative to read the switch values, and, as shown by a block 136, to determine whether they have changed. If the switch values read have changed, processing returns to the main routine 110 of FIG. 5.

As shown by a block 138, if the read switch values have not changed, the processor is operative to calculate the initial memory address where the data record of the selected sound is stored in loop format, and to get the data stored there as shown by a block 140.

As shown by a block 142, the processor is then operative to wait a time selected to synchronize the play-back rate to the sampling rate at which the prerecorded sound was digitally stored, and thereafter to send the data to the digital to analog converter as shown by a block 144. Although a software loop is employed in the exemplary embodiment for synchronization, it will be appreciated that hardware synchronization may be employed in accord with the present invention.

As shown by a block 146, the processor is then operative to calculate the next memory location and to determine if all of the data stored at the different data locations of the particular natural or other sound stored in loop format has been sent to the digital to analog converter, and if not, processing loops through the blocks 140, 142, 144 until that has been accomplished; otherwise, processing returns to the block 134.

Figure 7:
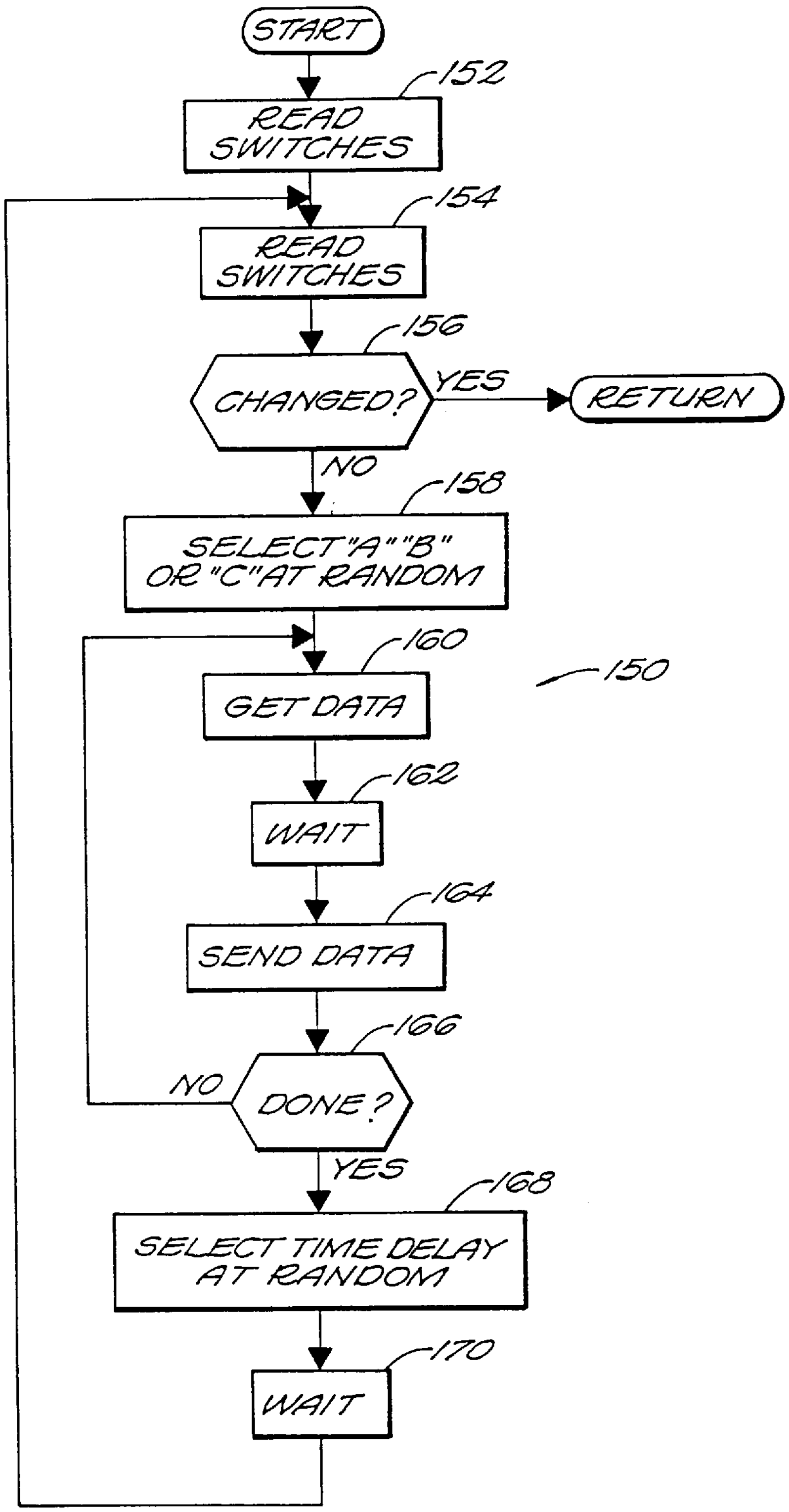
FIG. 7 is a flow chart illustrating an exemplary processor-implemented sound bite format play subroutine in accord with the present invention.

Returning now to FIG. 7, generally designated at 150 is a flow chart illustrating the sound bite play subroutine in accord with the present invention. As shown by blocks 152, 154, the processor is operative to read the switch values, and, as shown by a block 156, to determine whether they have changed. If the switch values read have changed, processing returns to the main routine 110 of FIG. 5.

As shown by a block 158, if the read switch values have not changed, the processor is operative to randomly select one of the three (3) different versions of the sound selected in sound bite format for replay and to get the data stored at the first address location of the selected plurality of the three (3) pluralities of address locations as shown by a block 160.

As shown by a block 162, the processor is then operative to wait a time selected to synchronize the play-back rate to the sampling rate at which the prerecorded sound was digitally stored and thereafter to send the data to the digital to analog converter as shown by a block 164. Although a software loop is employed in the exemplary embodiment for synchronization, it will be appreciated that hardware synchronization may be employed in accord with the present invention.

As shown by a block 166, the processor is then operative to calculate the next memory location and to determine if all of the data stored at the different data locations of that particular complete-in-itself and self-contained version of the same natural (or other) sound stored in sound bite format have been sent to the digital to analog converter, and if not, processing loops through the blocks 160, 162, 164 until that has been accomplished; otherwise, the processor calculates a random time as shown by a block 168. In the presently preferred embodiments, the time delay is selected at random between four (4) and twenty (20) seconds, although another range of values and other delays could be selected with the present invention.

Figure 8:
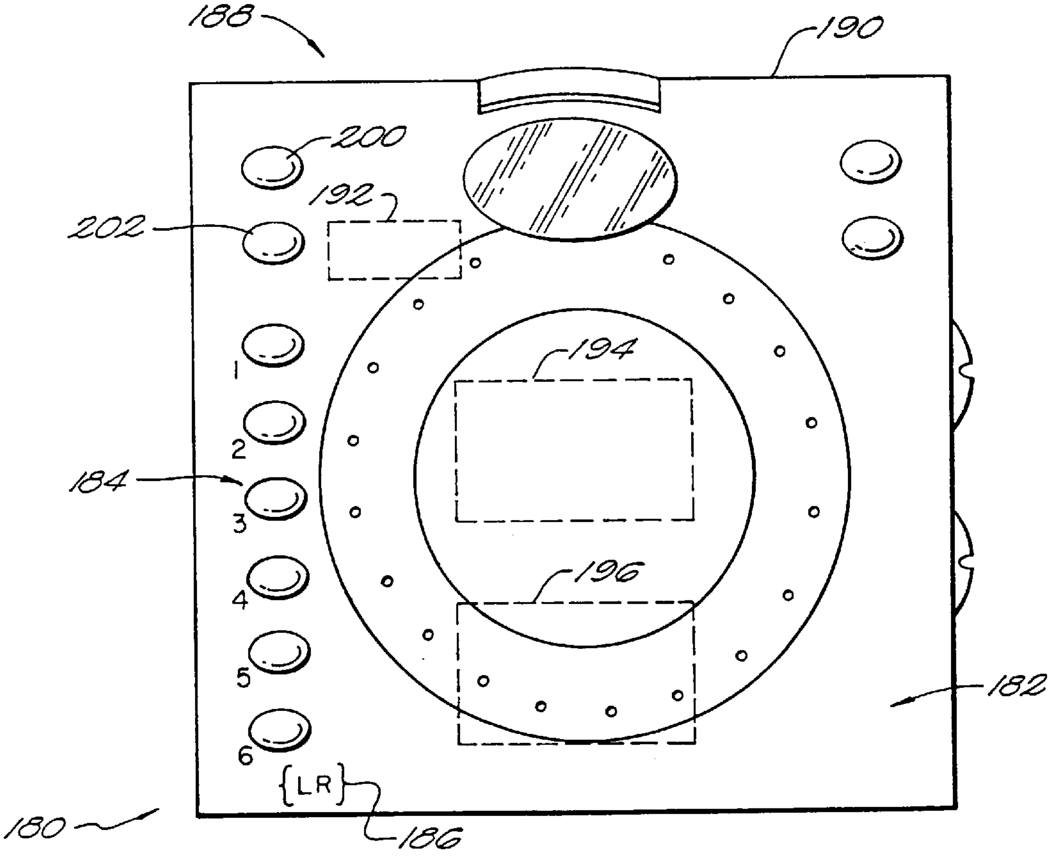
FIG. 8 is a front elevational view of another embodiment of an improved sound relaxation system in accord with the present invention that not only provides individuals the capability to customize their library of natural sounds, as in the embodiment of the FIG. 1, but also provides individuals the capability to select at least two (2) natural sounds of their library of natural sounds for concurrent replay in accord with the present invention.

Referring now to FIG. 8, generally designated at 180 is a front elevational view of another embodiment of an improved digital sound relaxation system in accord with the present invention. The device 180 not only provides individuals the capability to customize their library of natural sounds, by inserting any one of one or more collectable sound cards thereinto as in the device 10 of the FIGS. 1 and 2, but also provides individuals the capability to select two (2) (or more) natural or other sounds of their library (whether provided in internal, or internal and external memory) of natural and/or other sounds for concurrent replay.

The improved system 180 includes a housing generally designated 182 and a plurality of single-pole double-throw sound selector switches generally designated 184 arranged in laterally spaced apart relation proximate the left edge of the housing 182. Each of the switches 184 provides selection of one sound, when toggled to the left, and selection of another sound, when toggled to the right, as schematically illustrated by bracket 186. Although six (6) individual dual-position sound selector switches 184 providing selection of twelve (12) natural and/or other sounds are presently preferred, any number or kind of input device or devices may be employed in accord with the present invention.

A collectable sound card receiving port generally designated 188 is provided through the top wall 190 of the housing 182. Although it is preferred to locate the port 188 through the top wall 190 of the housing 182, any other collectable sound card receiving interface that is user-friendly, and easy-to-access, may be employed in accord with the present invention.

An electrical connector schematically illustrated in dashed outline 192 is provided in the port 188 of the housing 182. The electrical connector 192 is adapted to mate with the electrical connector 32 (FIG. 2) of the collectable sound card 30 (FIG. 2), which is not described again for the sake of brevity of disclosure.

The device 180 includes two (2) internal digital memories schematically illustrated in dashed lines 194, 196. In the exemplary embodiment described hereinbelow, a plurality of prerecorded natural or other sounds are digitally stored in loop format in one of the internal digital memories 194, 196 and a plurality of prerecorded natural or other sounds are digitally stored in sound bite format in the other one of the internal digital memories 194, 196. Although two (2) internal digital memories are disclosed in the exemplary embodiment, a different number of internal digital memory devices could be employed in accord with the present invention. The loop format and sound bite format are described above in connection with the description of the FIG. 3 and are not again described for the sake of brevity of disclosure.

A sound card selector switch 200 is mounted to the top wall 190 of the housing 182. In the "off" condition of the sound card selector switch 200, toggling any one of the switches 184 to the left selects another one of the prerecorded natural sounds stored in the memory 194 for replay, and toggling any one of the switches 184 to the right selects another one of the prerecorded natural sounds stored in the memory 196 for replay. In the "on" condition of the sound card selector switch 200, which reassigns the switches 184 from the internal memory 194 to the external memory of a collectable sound card inserted in the port 188, toggling any one of the switches 184 to the left selects another one of the prerecorded natural sounds stored in the external memory 34 (FIG. 2) of the collectable sound card for replay. In this manner, the same sound selector switches 184 are enabled to select among the plurality of prerecorded natural sounds contained either in the internal memory 184 of the device 180 or in the external memory 34 (FIG. 2) of each collectable sound card that may be inserted therewithin. The left positions of the six (6) switches 184 in the presently preferred embodiment, as reassignable by the selector switch 200, are able to select among twelve (12) prerecorded sounds, and the right positions of the six (6) switches 184 are able to select among another six (6) prerecorded sounds, thereby making available a total of eighteen (18) prerecorded sounds for selectable replay.

A combine switch 202 is mounted to the front of the housing 182 of the device 180. The combine switch enables individuals to select for concurrent replay one of the sounds selected by toggling one of the switches of the plurality of switches 184 to the left, with one of the sounds selected by toggling one of the switches of the plurality of switches 184 to the right, thereby making available a total of thirty-six (36) composite sounds for selectable replay.

The sound card selector switch 200 and the combine switch 202 enable individuals to select for concurrent replay any one of the sounds prerecorded in either the internal or external memories 194, 34 (FIG. 3), as determined by the left toggle positions of the plurality of switches 184 that may be reassigned, as described above, from internal to external memory by the sound card selector switch 200, with any one of the sounds prerecorded in the internal memory 196, as determined by the right toggle positions of the plurality of switches 18, and by the combine switch 202. The left toggle positions of the six (6) switches 184 in the presently preferred embodiment, as reassignable by the sound card selector switch 200, are able to select among twelve (12) prerecorded sounds, which twelve (12) sounds are each combinable, by depressing the combine switch 202, with another one of the six (6) sounds selected by toggling the six (6) sound selector switches 184 to the right, thereby making available a total of seventy-two (72) composite sounds for selectable replay.

Taking the eighteen (18) sounds available by toggling any one of the six (6) switches 184 to the left, as reassignable by the selector switch 200, and by toggling any one of the six (6) switches 184 to the right, together with the seventy-two (72) composite sounds available by toggling any one the six (6) switches 184 to the left, as reassignable by the selector switch 200, and combining the same, by depressing the combine switch 202, with another one of the six (6) sounds selected by toggling another one of the six (6) sound selector switches 184 to the right, makes for a grand total of ninety (90) different sounds in the presently preferred embodiment.

The device 180 of the invention is operable in one of four (4) basic modes. In one mode, any prerecorded sound stored in the first internal digital memory is replayed by toggling the corresponding one of the sound selector switches assigned thereto to the left, in another mode, any prerecorded sound stored in external digital memory of a collectable sound card inserted therewithin is replayed by depressing the sound card selector switch and by toggling the corresponding one of the sound selector switches to the left, in a third mode, any prerecorded sound stored in the second internal digital memory is replayed by toggling the corresponding one of the sound selector switches assigned thereto to the right, and in a fourth mode, two (2) or more sounds stored in either internal or external memory may be combined for concurrent replay by toggling the sound selector switches to the left, by depressing the combine switch, and by toggling the sound selector switches to the right; and by depressing the sound card selector switch, by toggling the sound selector switches to the left, by depressing the combine switch, and by toggling the sound selector switches to the right. Any processor programmed to provide operation in these four (4) modes may be employed in accord with the present invention.

In any of the foregoing modes of operation, the sound selected for replay is reproduced through dual, phase-shifted stereo speakers, not shown, to provide realistic playback. In the presently preferred embodiment, the sounds stored in the memory 194 are Ocean Surf, Stream, Rain on Water, Waterfall, Summer Night and Wind sounds, the sounds stored in the memory 196 are Sea Gulls, Song Birds, Thunder, Fog Horn, Loons and Rain on Forest Floor sounds, and the sounds stored on the collectable sound card are grouped themewise, such as the Thunderstorm in the Wilderness, Forest Rain, Waterfall, Loons on Wilderness Lake, Mountain Valley Windstorm, and Roaring Bonfire sounds of the so-called Wilderness Retreat collectable sound card. In the illustrated embodiment, the device 180 includes a lighted clock, a dual alarm/snooze button, an AM/FM radio, headphone jacks, an off/resume button, a four position timer, and bass/treble controls, all not further described as forming no part of the present invention.

Figure 9:
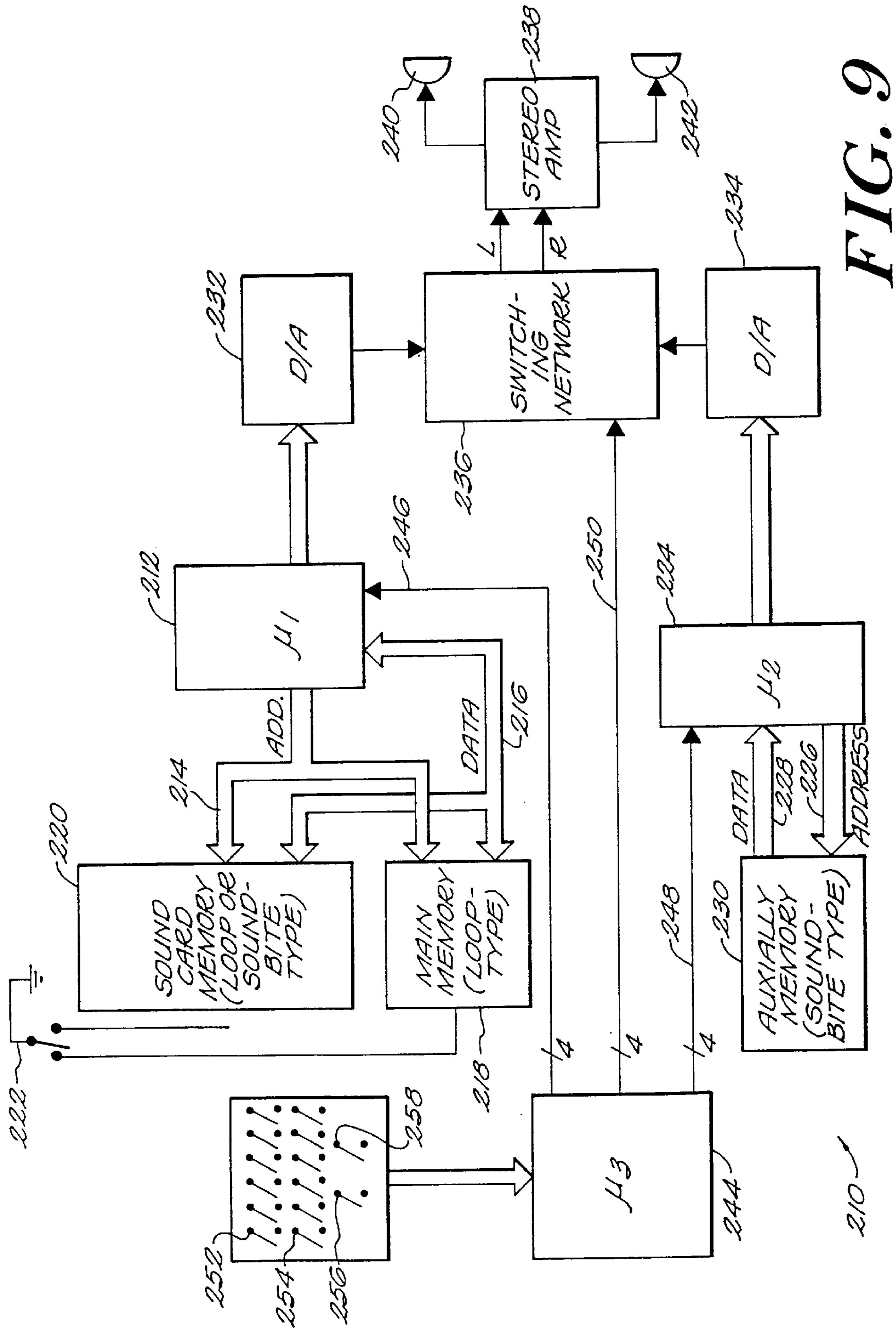
FIG. 9 is a circuit block diagram of an exemplary embodiment of the improved digital sound relaxation system of the FIG. 8 in accord with the present invention.

Referring now to FIG. 9, generally designated at 210 is a circuit block diagram of an exemplary embodiment of the improved-flexibility digital sound relaxation system of the FIG. 8 in accord with the present invention. A first processor 212 is connected via address and data lines 214, 216 to internal digital memory (RAM) 218 and to external digital memory (RAM) 220. Sound card selector switch 222 is electrically connected between ground and the chip enable terminals of the internal and external digital memories 218, 220. Program read only memory (ROM), not shown, is connected in well-known manner to the address and data lines 214, 216. As appears more fully below, the first processor 212 is dedicated to replay the sounds stored in either the memory 218 or the external memory 220 of a collectable sound card, in either or both of the loop and sound bite formats.

A second processor 224 is connected via address and data lines 226, 228 to internal digital memory (RAM) 230. Program read only memory (ROM), not shown, is connected to the address and data lines 226, 228 in well-known manner. As appears more fully below, the second processor 224 is dedicated to replay the sounds stored in the memory 230.

A digital to analog converter 232 is coupled to an output port of the processor 212, and a digital to analog converter 234 is coupled to an output port of the processor 224.

A switching network 236 is coupled to each of the digital to analog converters 232, 234, and a stereo amplifier 238, to which dual speakers 240, 242 are connected, is connected to the switching network 236. In the exemplary embodiment, the switching network 236 is preferably implemented by IC 4066 Quad switches and the stereo amplifier by the Sony CXA167M/P IC. The switching network 236 enables sound playback through both channels of the stereo amplifier if either processor 212, processor 224 or both processors 212 and 224 are enabled in a manner to be described.

A master control processor 244 is coupled to the first dedicated processor 212 via control lines 246, to the second dedicated processor 224 via control lines 248 and to the switching network via control lines 250. A first plurality of sound selector switches 252 preassigned to another one of the natural or other sounds stored in the memory 218 of the processor 212, a second plurality of sound selector switches 254 preassigned to another one of the natural or other sounds stored in the memory 230 of the processor 224, a sound card selector switch 256 and a combine switch 258 are connected to an input port of the processor 244.

The master control processor 244 decodes the switch values selected, latches the same and provides control input, via the control lines 246, 250, to the first and second dedicated processors 212, 224, that instructs the dedicated processors 212, 224 to play or to not play the particular sounds selected either in stand-alone mode, when sounds of either dedicated processor 212, 224 have been selected, or in combined playback mode, when sounds of both dedicated processors 212, 224 have been selected, and provides control input, via the control lines 248, to the switching network 236 that configures the same to provide dual-channel playback for either the stand-alone playback modes of each of the dedicated processors 212, 224 or the combined playback mode of both of the dedicated processors 212, 224.

Figure 10:
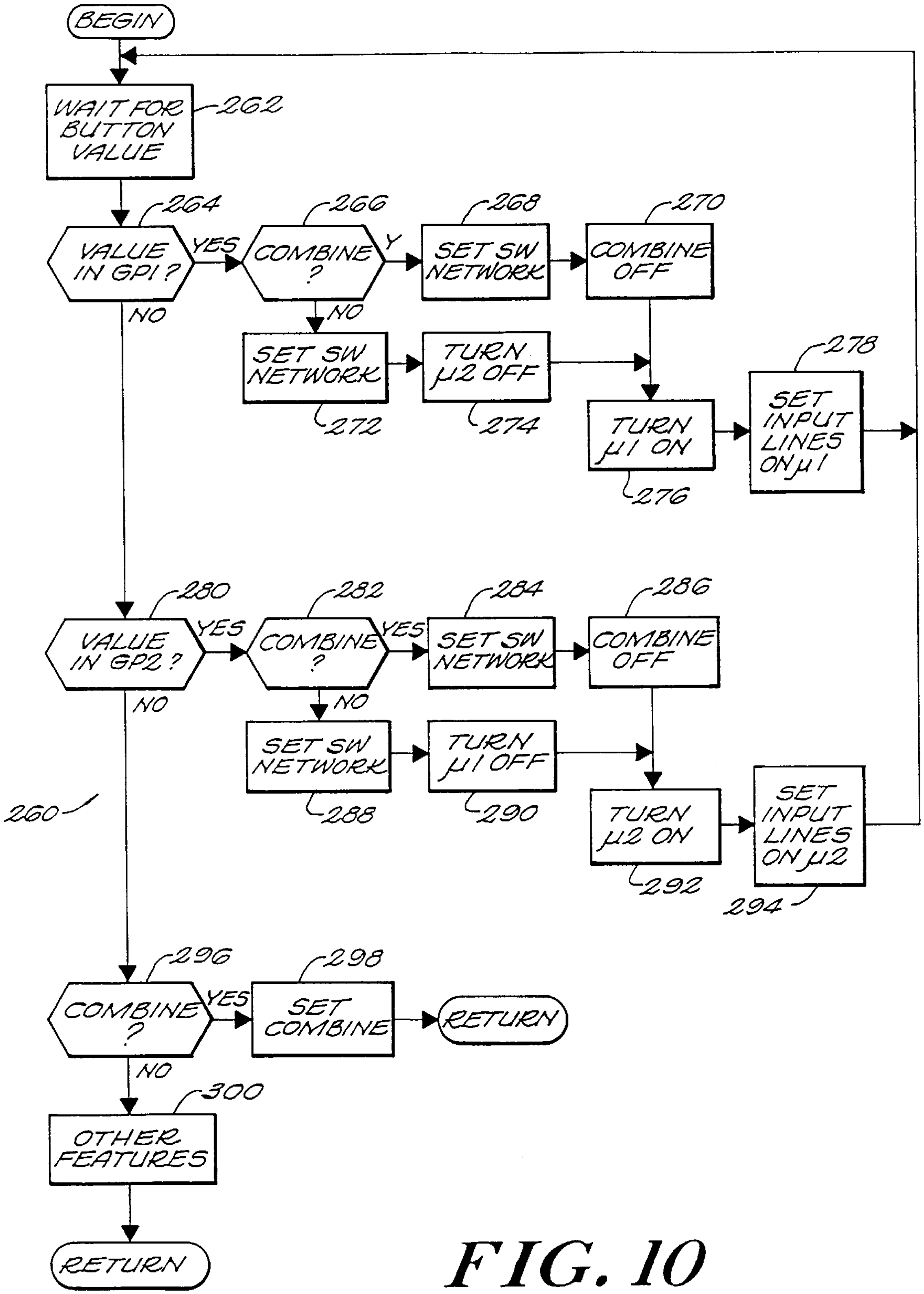
FIG. 10 is a flow chart illustrating an exemplary processor-implemented main routine of the exemplary FIG. 8 embodiment in accord with the present invention.

Referring now to FIG. 10, generally designated at 260 is a flowchart of the main routine of the master control processor in accord with the exemplary embodiment of the present invention. As shown by a block 262, the master control processor is operative to wait for a button to be activated.

As shown by a block 264, the processor is operative to determine if the activated button corresponds to the group of sounds preassigned to the first dedicated sound playback processor and if it is, determines whether the combine switch has been previously depressed as shown by a block 266.

As shown by a block 268, if the combine switch has been previously depressed, the master control processor sets the switching network to switch the sound played by one of the dedicated processors to one channel and the sound played by the other of the dedicated processors to the other channel of the stereo amplifier and turns the combine mode "off" as shown by a block 270.

As shown by a block 272, if the combine switch has not been depressed, the master control processor is operative to set the switching network to switch the selected sound played by the first dedicated processor to both the channels of the stereo amplifier, and to turn the second dedicated processor "off" as shown by the block 274.

As shown by the block 276, the master control processor is then operative to turn the first dedicated sound playback processor "on" and to set the input control lines thereto to identify the sound selected as shown by the block 278.

As shown by a block 280, if the activated button does not correspond to the group of sounds preassigned to the first dedicated sound playback processor, the master control processor is operative to determine if it corresponds to the group of sounds preassigned to the second dedicated sound playback processor.

If it does, the master control processor is operative to determine whether the combine switch has been previously depressed as shown by a block 282.

As shown by a block 284, if the combine switch has been previously depressed, the master control processor sets the switching network to switch the sound played by one of the dedicated processors to one channel and the sound played by the other of the dedicated processors to the other channel of the stereo amplifier, and turns the combine mode "off" as shown by a block 286.

As shown by a block 288, if the combine switch has not been depressed, the master control processor is operative to set the switching network to switch the selected sound played by the second dedicated processor to both of the channels of the stereo amplifier, and to turn the first dedicated processor "off" as shown by the block 290.

As shown by the block 292, the master control processor is then operative to turn the second dedicated sound playback processor "on" and to set the input control lines thereto to identify the sound selected as shown by the block 294.

As shown by a block 296, if the activated button does not correspond to the group of sounds preassigned to either the first or the second dedicated sound playback processors, the master control processor is operative to determine if the combine switch has been depressed. If it has, as shown by the block 298, the master control processor is operative to flag the combine mode, and processing returns to the block 262; otherwise, and as shown by the block 300, the master control processor is operative to determine if any of the switches that correspond to the alarm clock, radio and other features of the improved-flexibility sound relaxation have been activated, and takes the corresponding control action as shown by the block 300, which block 300, forming no part of the present invention, is not further described herein, and processing returns to the block 262.

The main routine for each of the dedicated first and sound playback processors is the same as the main routine described above in connection with the description of FIG. 5, except that instead of reading the switch values each of the dedicated sound playback processors reads its input control lines to determine whether it has been enabled and if so, to determine which of its group of sounds has been selected. The loop format and sound bite format subroutines called thereby are the same as the loop format and sound bite format subroutines described above in connection with the description of the FIGS. 6 and 7, with the exception that instead of reading the switch values each of the dedicated sound playback processors reads its input control lines. The main routine, and the loop format and sound bite format subroutines, are not again described herein for the sake of brevity of explication.

Many modifications of the presently disclosed invention will become apparent to those of skill in the art having benefited by the instant invention without departing from the scope of the appended claims.

What is claimed is:

1. An improved digital sound relaxation system that enables individuals to selectably choose, according to their individual tastes, a combination of at least two (2) individual prerecorded natural sounds of a plurality of prerecorded natural sounds for concurrent replay, comprising:

(1) a first digital memory in which a first plurality of prerecorded natural sounds are stored in a predetermined manner;

(2) at least one first sound selector switch for selecting any individual one of said first plurality of prerecorded natural sounds stored in said first digital memory for replay;

(3) a second digital memory in which a second plurality of prerecorded natural sounds are stored in a predetermined manner;

(4) at least one second sound selector switch for selecting any individual one of said second plurality of prerecorded natural sounds stored in said second digital memory for replay;

(5) a third switch to select for replay a sound that is a combination of the individual sounds selected by activating said at least one first and second switches; and (6) a processor coupled to said digital memories and responsive to said switches operable in one of two (2) basic modes; in one mode, any prerecorded sound stored in at least one of said digital memories is individually replayed by activating at least one of said first and second sound selector switches, and in another mode, any combination of at least two (2) individual prerecorded sounds stored in said digital memories are concurrently replayed by activating said first and second sound selector switches and said third switch.

2. The improved digital sound relaxation system of claim 1, wherein the prerecorded natural sounds are stored in a "loop" format in one of the first and second memories, and in sound bite format in the other of the first and second memories, where said loop format defines (1) a plurality of addressable memory locations and (2) start and end locations, such that a different part of the same natural sound is stored at another address location and in such a way that the parts stored at the start and end locations are as acoustically-seamless as possible, and where said sound bite format defines at least two (2) groups of addressable memory locations, such that another self-contained and complete-in-itself version of the same natural sound is stored in each of said at least two (2) groups of addressable memory locations.

3. An improved-flexibility digital sound relaxation system that allows a user to select composite-sounds for playback tailored to their individual preferences and personal tastes in a composite-sounds playback mode as well as to select single-sounds for individual playback in a single-sounds playback mode, comprising;

a digital sound relaxation device having (1) at least one user input device for allowing user selection of prerecorded sounds of a library of individual prerecorded sounds both for individual replay and for concurrent replay, (2) at least one digital memory in which are digitally stored a first plurality of prerecorded individual continuous-type sounds, and in which are digitally stored a second plurality of prerecorded individual intermittent-type sounds, which first and second pluralities of prerecorded sounds provide said library of individual sounds that may be selected by means of said at least one user input device for individual replay in said single-sounds playback mode and that may be individually selected by means of the at least one user input device for concurrent replay tailored to the individual preferences and personal tastes of the user in said composite-sounds playback mode and (3) a digital controller coupled to said at least one digital memory and to said at least one user input device, responsive to at least one user input selection in said single-sounds replay mode, to individually replay any one of at least said first plurality of sounds of said library of said first and second pluralities of individual prerecorded sounds that has been user selected for individual replay, and responsive to at least one user input selection in said composite-sounds replay mode, to concurrently replay any individual one of said first plurality of individual prerecorded continuous-type sounds with any individual one of said second plurality of individual prerecorded intermittent-type sounds that have been individually user selected for concurrent replay in accord with the individual preferences and personal tastes of each user.

4. The improved-flexibility digital sound relaxation system that allows a user to select composite-sounds for playback tailored to their individual preferences and personal tastes as well as to select single-sounds for playback of claim 3, wherein said first plurality of prerecorded continuous-type sounds are stored in loop format and wherein said second plurality of prerecorded intermittent-type sounds are stored in sound-bite format.

5. The improved-flexibility digital sound relaxation system that allows a user to select composite-sounds for playback tailored to their individual preferences and personal tastes as well as to select single-sounds for playback of claim 3, wherein at least part of said library of sounds is prerecorded on a digital memory of a collectable sound card.

6. An improved-flexibility digital sound relaxation system having single-sounds and composite-sounds playback modes that allows a user to select composite-sounds for playback tailored to their individual preferences and personal tastes in composite-sounds playback mode as well as to select single-sounds for playback in single-sounds playback mode, comprising:

a digital memory device;

a library of individual prerecorded sounds digitally stored in said digital memory device having a first plurality of continuous-type sounds each individually selectable for replay, and having a second plurality of intermittent-type sounds each individually selectable for replay, each said intermittent-type sound of said second plurality of intermittent-type sounds being constituted by multiple, different, complete-in-itself versions;

an operator input device for allowing user selection of any individual continuous-type sound for playback in said single-sounds playback mode and for allowing user selection of any individual continuous-type sound and of any individual intermittent-type sound of said library of individual prerecorded sounds for concurrent playback in said composite-sounds playback mode; and a digital controller coupled to said digital memory device and to said operator input device operative in response to user selection of an individual continuous-type sound of said library of individual prerecorded sounds in said single-sounds playback mode to replay the individual continuous-type sound selected for replay, and operative in said composite-sounds playback mode in response to user input selection of any individual continuous-type sound of said first plurality of sounds of said library of individual sounds selected for concurrent replay and to user input selection of any individual intermittent-type sound of said second plurality of sounds of said library of individual sounds selected for concurrent replay, to concurrently replay the individual continuous-type sound selected with different ones of the multiple, different, complete-in-itself versions of the individual intermittent-type sound selected, such that the different versions are individually selected for replay at random, and in such a way that each randomly selected version is replayed at a random time.

* * * * *

US005867580C1

(12) EX PARTE REEXAMINATION CERTIFICATE (5019th)

United States Patent

Anderson et al.

(10) Number: US 5,867,580 C1

(45) Certificate Issued: Nov. 16, 2004

(54) FLEXIBILITY DIGITAL SOUND RELAXATION SYSTEM

(76) Inventors: Troy Gene Anderson, 26 Phillips St., Marblehead, MA (US) 01945; Rudy Anthony Vandenbelt, 310 Billings Avenue, Ottawa, Ontario (CA), K1H 5L3

Reexamination Request:
No. 90/005,591, Dec. 15, 1999

Reexamination Certificate for:

| | |
|---|---|
| Patent No.: | **5,867,580** |
| Issued: | **Feb. 2, 1999** |
| Appl. No.: | **08/706,134** |
| Filed: | **Aug. 30, 1996** |

(51) Int. Cl.[7] .................................................. H03G 3/00
(52) U.S. Cl. ......................................................... 381/61
(58) Field of Search ......................... 340/384.72, 384.3, 340/384.11; 446/404; 381/61, 62, 63, 118; 84/603, 604, 605, 606; 704/272; 40/906, 717, 455, 457; 309/30

(56) References Cited

U.S. PATENT DOCUMENTS 3,222,455 A * 12/1965 Golik .......................... 381/28
5,145,447 A * 9/1992 Goldfarb .................... 446/468
5,619,179 A 4/1997 Smith .................... 340/384.72

OTHER PUBLICATIONS

"Marsona 1250 sound conditioner (a product by Marpac corporation)", 1992, pp1–2.*
"Digital Sound Soother XS: SI 430" pp1–7.*

* cited by examiner

*Primary Examiner*—Minsun Oh Harvey

(57) ABSTRACT

In one embodiment, an improved-customizability digital sound relaxation system having a sound card receiving port and a collectable sound card are cooperative to play prerecorded natural or other sounds by depressing one of a plurality of sound selector switches and a sound card selector switch. The new sounds of each collectable sound card customize the library of available sounds to individual taste. In another embodiment, an improved-flexibility digital sound relaxation system having at least two (2) prerecorded sounds stored at first and second memory locations of internal or extenal/internal memory devices may be selected and combined for concurrent and/or individual replay by depressing one of a plurality of sound selector switches and a combine switch, or by depressing one of a pluarity of sound selector switches, a sound card selector switch and a combine switch. In this manner, from eighteen (18) digitally prerecorded sounds of the preferred embodiment ninety (90) individually selectable and/or combinable sounds are made available. In either embodiment, natural or other sounds may be stored in loop or sound bite format in either or both of the internal and external memories.

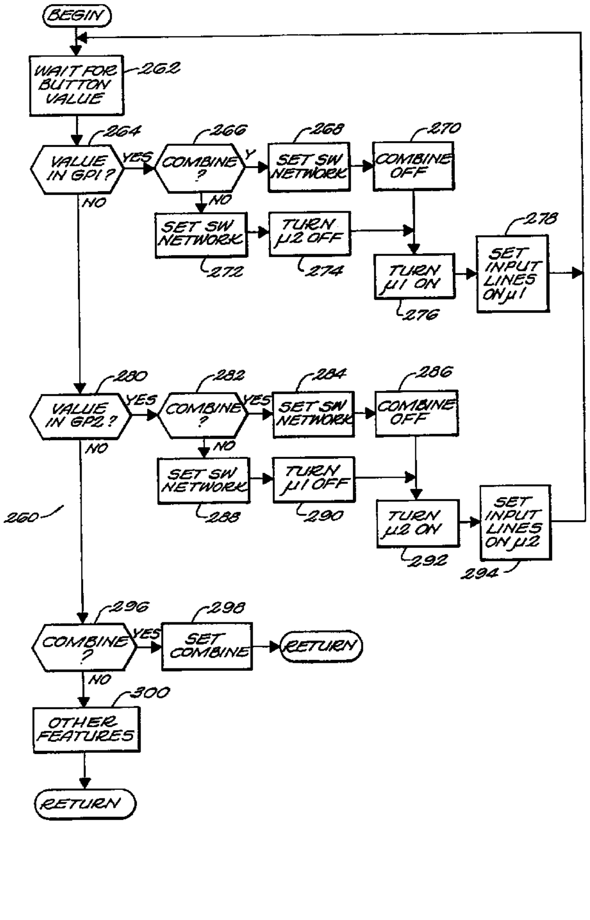

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–6 are cancelled.

* * * * *